United States Patent
Gong et al.

(10) Patent No.: US 10,532,923 B2
(45) Date of Patent: Jan. 14, 2020

(54) ACTIVE MEMS DAMPING

(71) Applicant: Futurewei Technologies, Inc., Plano, TX (US)

(72) Inventors: Jianmin Gong, San Jose, CA (US); Francis Man, Lexington, MA (US); Dongyu Geng, Shenzhen (CN); Xin Tu, Wuhan (CN); Ming Li, Wuhan (CN); Jiejiang Xing, Wuhan (CN); Yusheng Bai, Los Altos Hills, CA (US)

(73) Assignee: Futurewei Technologies, Inc., Plano, TX (US)

( * ) Notice: Subject to any disclaimer, the term of this patent is extended or adjusted under 35 U.S.C. 154(b) by 150 days.

(21) Appl. No.: 15/896,607

(22) Filed: Feb. 14, 2018

(65) Prior Publication Data

US 2019/0248647 A1 Aug. 15, 2019

(51) Int. Cl.
*B81B 7/00* (2006.01)
*H02K 33/16* (2006.01)
*G02B 26/08* (2006.01)
*H02K 33/18* (2006.01)

(52) U.S. Cl.
CPC .......... *B81B 7/0016* (2013.01); *G02B 26/085* (2013.01); *G02B 26/0841* (2013.01); *H02K 33/16* (2013.01); *H02K 33/18* (2013.01); *B81B 2201/045* (2013.01)

(58) Field of Classification Search
CPC ............ B81B 7/0016; B81B 2201/045; G02B 26/0841; G02B 26/085; H02K 33/16; H02K 33/18
See application file for complete search history.

(56) References Cited

U.S. PATENT DOCUMENTS

| | | | |
|---|---|---|---|
| 2004/0252005 | A1 | 12/2004 | Villhard et al. |
| 2009/0244668 | A1 | 10/2009 | Fujino et al. |
| 2017/0343350 | A1 | 11/2017 | Geisberger |
| 2018/0332259 | A1 | 11/2018 | Le Gros et al. |

FOREIGN PATENT DOCUMENTS

CN 105378543 A 3/2016

OTHER PUBLICATIONS

Yamamoto, et al., "Development of a Large-scale 3D MEMS Optical Switch Module," NTT Microsystem Integration Laboratories, Atsugi-shi, 243-0198, Japan, vol. 1, No. 7, Oct. 2003, pp. 37-42.

(Continued)

*Primary Examiner* — Wen Huang
(74) *Attorney, Agent, or Firm* — Conely Rose, P.C.

(57) ABSTRACT

Methods and apparatus for reducing the oscillation of a MEMS actuator. In one embodiment, a driving signal is generated to adjust the MEMS actuator through a set of driving wires coupled to the MEMS actuator. A motion-induced signal from the set of driving wires coupled to the MEMS actuator is received in response to the driving signal. The motion-induced signal is filtered to generate a filtered motion-induced signal. The filtered motion-induced signal is amplified to generate an amplified filtered motion-induced signal. The driving signal is adjusted based on the amplified filtered motion-induced signal to reduce the oscillation of the MEMS actuator.

17 Claims, 4 Drawing Sheets

(56) References Cited

OTHER PUBLICATIONS

Zhang, et al., "Pressure-Dependent Damping Characteristics of Micro Silicon Beam Resonators for Different Resonant Modes," 4 pages.
Plander, et al., "MEMS optical switch: Switching time reduction," Open Comput. Sci. 2015, 6: pp. 116-125.
Foreign Communication From A Counterpart Application, PCT Application No. PCT/CN2019/074931, English Translation of International Search Report dated May 8, 2019, 5 pages.
Foreign Communication From A Counterpart Application, PCT Application No. PCT/CN2019/074931, English Translation of Written Opinion dated May 8, 2019, 4 pages.

ACTIVE MEMS DAMPING

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

Embodiments of the present disclosure relate to the field of optical communications, and in particular, to a method and an apparatus for providing active microelectromechanical systems (MEMS) damping.

BACKGROUND

MEMS is a technology that in its most general form can be defined as miniaturized mechanical and electro-mechanical elements (i.e., devices and structures) that are made using the techniques of microfabrication. The physical dimension of a MEMS device can range from several millimeters to less than one micrometer. Likewise, the types of MEMS devices can vary from relatively simple structures having no moving elements, to extremely complex electromechanical systems with multiple moving elements under the control of integrated microelectronics.

SUMMARY

According to one aspect of the present disclosure, there is provided a method for reducing the oscillation of a MEMS actuator. In one embodiment, a driving signal is generated to adjust the MEMS actuator through a set of driving wires coupled to the MEMS actuator. A motion-induced signal from the set of driving wires coupled to the MEMS actuator is received in response to the driving signal. The motion-induced signal is filtered to generate a filtered motion-induced signal. The filtered motion-induced signal is amplified to generate an amplified filtered motion-induced signal. The driving signal is adjusted based on the amplified filtered motion-induced signal to reduce the oscillation of the MEMS actuator.

According to a second aspect of the present disclosure, a MEMS optical switch is disclosed. The MEMS optical switch includes a driver unit configured to generate a driving signal to adjust a MEMS actuator through a set of driving wires coupled to the MEMS actuator. The MEMS optical switch also includes an amplifier with a bandpass filter that is configured to receive a motion-induced signal from the set of driving wires coupled to the MEMS actuator in response to the driving signal. The bandpass filter is configured to filter the motion-induced signal to generate a filtered motion-induced signal. The amplifier is configured to amplify the filtered motion-induced signal to generate an amplified filtered motion-induced signal. The driver circuit is configured to adjust the driving signal based on the amplified filtered motion-induced signal to reduce the oscillation of the MEMS actuator.

Optionally, in any of the preceding aspects, the MEMS is an electromagnetic MEMS actuator, and the motion-induced signal is a voltage determined using formula: $V=-N*S*d(B*\sin\theta)/dt$, where N is a number of coil turns of a coil of the electromagnetic MEMS actuator, S is an area of the coil, B is a magnetic field, and $\theta$ is an angle of a coil plane to the magnetic field.

Optionally, in any of the preceding aspects, the MEMS is an electrostatic MEMS actuator, and the motion-induced signal is a current determined using formula: $I=V*d(C(\theta))/dt$, where V is a voltage applied to the electrostatic MEMS actuator, $\theta$ is the angle of two electrode plates of the electrostatic actuator, and $C(\theta)$ is a capacitance of the two electrode plates of the electrostatic actuator that depends on $\theta$.

Optionally, in any of the preceding aspects, the motion-induced signal may be amplified between 5× and 50×. The process of filtering the motion-induced voltage may remove a direct current component from the motion-induced voltage. The oscillation of the MEMS actuator is caused in part by external vibration shock to the MEMS actuator.

The above aspects and other aspects as well as the advantages thereof are described below in the Detailed Description.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

The illustrated figures are only exemplary and are not intended to assert or imply any limitation with regard to the environment, architecture, design, or process in which different embodiments may be implemented. Any optional component or steps are indicated using dash lines in the illustrated figures.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

As used within the written disclosure and in the claims, the terms "including" and "comprising" are used in an open-ended fashion, and thus should be interpreted to mean "including, but not limited to". Unless otherwise indicated, as used throughout this document, "or" does not require mutual exclusivity, and the singular forms "a", "an", and "the" are intended to include the plural forms as well, unless the context clearly indicates otherwise.

A module or unit as referenced herein may comprise one or more hardware or electrical components such as electrical circuitry, processors, and memory that may be specially configured to perform a particular function. The memory may be volatile memory or non-volatile memory that stores data such as, but not limited to, computer executable instructions, machine code, and other various forms of data. The module or unit may be configured to use the data to execute one or more instructions to perform one or more tasks. In certain instances, a unit may also refer to a particular set of functions, software instructions, or circuitry that is configured to perform a specific task.

When a MEMS mirror is switched from one position to another, or receives an external shock, the MEMS mirror actuator will usually oscillate at a resonance frequency for many periods before the oscillation amplitude decays to zero. Such effect severely limits the response time of a MEMS-based switch, and its tolerance to the vibration. Accordingly, the disclosed embodiments seek to provide one or more solutions to suppress the oscillation and thus increase the response time of a MEMS-based switch.

Figure 1:
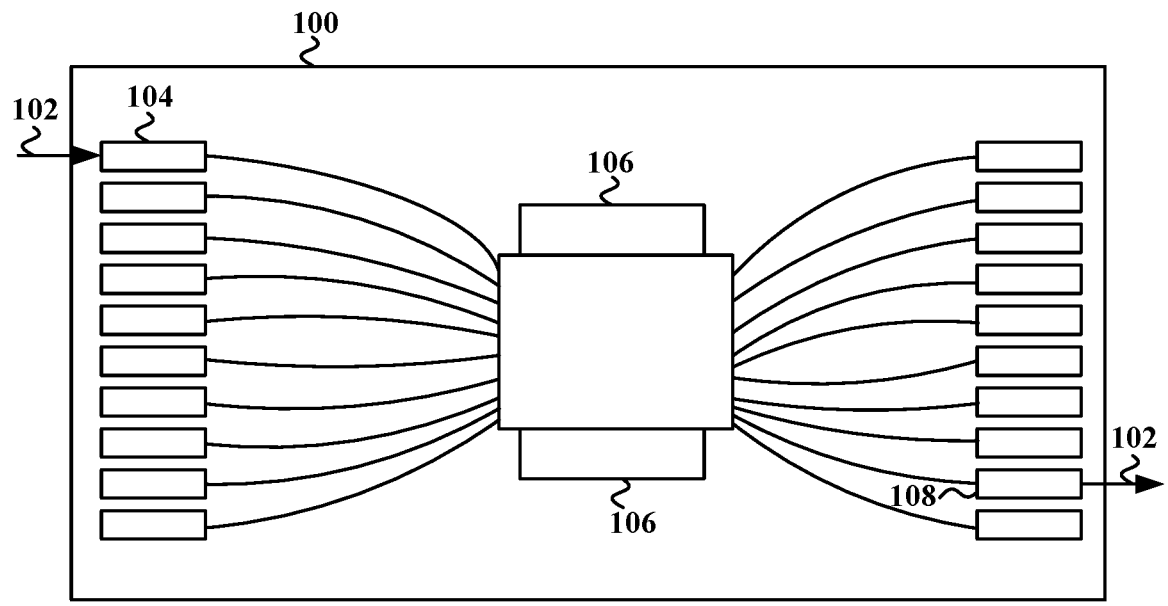
FIG. 1 is a schematic diagram illustrating an example of a MEMS optical switch in accordance with an embodiment.

FIG. 1 is a schematic diagram illustrating an example of a MEMS optical switch 100 in accordance with an embodiment. The MEMS optical switch 100 is configured to direct an incoming optical signal from an incoming port to a desired output port based on the intended destination of the optical signal using one or more MEMS mirror package 106. For example, an incoming optical signal 102 may be received at an incoming port 104 and directed by the one or more MEMS mirror package 106 to output to an output port 108. The MEMS optical switch 100 may have hundreds of incoming ports 104 and hundreds of output ports 108.

Figure 2:
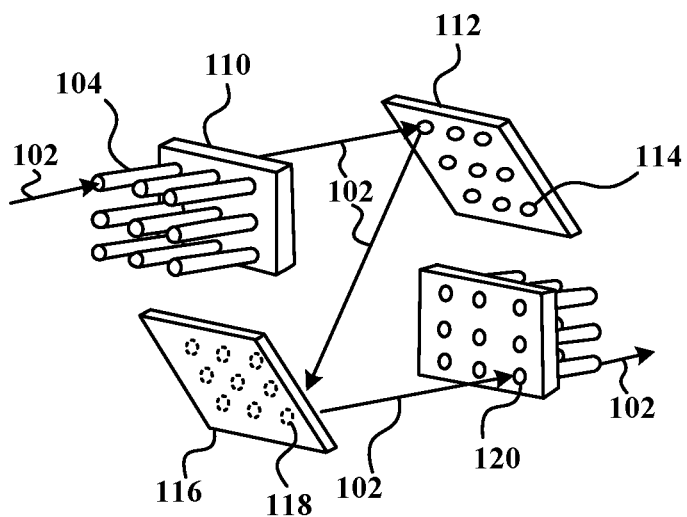
FIG. 2 is a diagram illustrating an example of a switch configuration in a MEMS optical switch in accordance with an embodiment.

FIG. 2 is a diagram illustrating an example of a switch configuration in the MEMS optical switch 100 in accordance with an embodiment. As illustrated in FIG. 2, the incoming optical signal 102 is received at the incoming port 104 or fiber line that is part of a collimator 110. The collimator 110 is configured to produce a parallel beam of light of the incoming optical signal 102 that is directed to a micromirror array 112 that includes a plurality of MEMS mirrors 114. The MEMS mirror 114 is adjusted such that the incoming optical signal 102 is reflected to a desired MEMS mirror 118 on a micromirror array 116. The incoming optical signal 102 is then reflected off the MEMS mirror 118 on the micromirror array 116 to the desired output port 108. Thus, the incoming optical signal 102 from an incoming port 104 is switched by the MEMS optical switch 100 to a desired output port 108. The direction in which the incoming optical signal 102 is reflected can be changed by rotating the MEMS mirror 114 to different angles, allowing the incoming optical signal 102 to be connected to any desired output port 108. Although only a single incoming optical signal 102 is described, the MEMS optical switch 100 is operable to switch large numbers of optical signals simultaneously.

Figure 3:
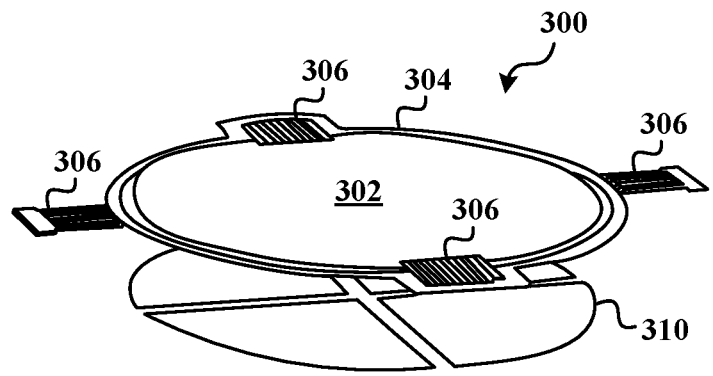
FIG. 3 is a diagram illustrating an example of a MEMS mirror in accordance with an embodiment.

FIG. 3 is a diagram illustrating an example of a MEMS mirror 300 in accordance with an embodiment. In the depicted embodiment, the MEMS mirror 300 comprises a micromirror 302 that is mounted on a metal frame 304. An example diameter size of the micromirror 302 is 600 micrometer (μm). The micromirror 302 may be gimbaled on two pairs of serpentine springs 306, which are connected by the metal frame 304 around the micromirror 302. This enables the micromirror 302 to rotate along two orthogonal axes and to direct the angle of reflection of an optical signal. In this embodiment, actuation of the micromirror 302 is carried out by electrostatics using an electrode 310 underneath the micromirror 302 to form a capacitor with the micromirror 302 (i.e., an electrostatic MEMS actuator). For example, in one embodiment, voltage may be applied between the micromirror 302 and the electrode 310. The micromirror 302 rotates about the torsion axis until the restoring torque of the serpentine springs 306 and the electrostatic torque are equal. The serpentine springs 306 restore the micromirror 302 to its default horizontal state when no power is applied.

Although an electrostatic MEMS actuator is depicted in FIG. 3, other types of MEMS actuators may be employed in accordance with the disclosed embodiments such as an electromagnetic MEMS actuator in which a magnetic field can be induced using electrical current to generate the force exerted on electromagnetic coils to adjust the micromirror 302.

As stated above, when the micromirror 302 is switched from one position to another, or when it receives an external shock, the MEMS actuator will usually oscillate at the resonance frequency for many periods before the oscillation amplitude decays to zero. Such effect severely limits the response time of a MEMS-based switch, and its tolerance to the vibration. Accordingly, the disclosed embodiments seek to provide one or more solutions to suppress the oscillation and thus increase the response time of a MEMS-based switch. For example, in one embodiment, a motion-induced signal (e.g., voltage for electromagnetic MEMS, or current for electrostatic MEMS) is determined from the set of driving wires coupled to the MEMS actuator in response to a driving signal. The motion-induced signal is band filtered and amplified. The filtered/amplified signal is fed back to adjust the driving signal, which retards the motion of a MEMS actuator and provides an active damping friction.

Figure 4:
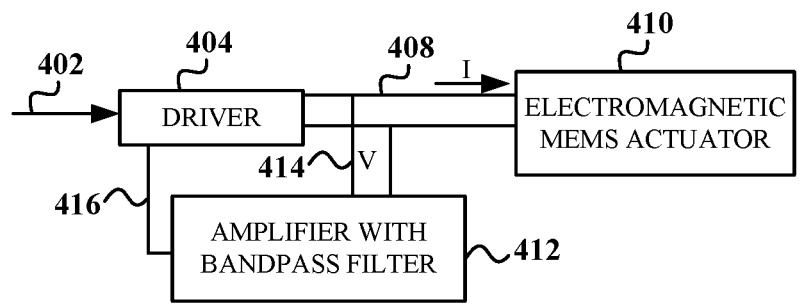
FIG. 4 is a schematic diagram illustrating an example of a feedback loop for reducing the oscillation of an electromagnetic MEMS actuator in accordance with an embodiment.

FIG. 4 is a schematic diagram illustrating an example of a feedback loop for reducing the oscillation of an electromagnetic MEMS actuator in accordance with an embodiment. In the depicted embodiment, a control signal 402 is sent to a driver unit 404 that is configured to generate a driving signal 408 to adjust a MEMS mirror that uses an electromagnetic MEMS actuator 410.

The angular vibration of a typical MEMS can be expressed as:

$$\frac{d^2\theta(t)}{dt^2} + \frac{r}{m}\frac{d\theta(t)}{dt} + \omega^2\theta(t) = f(t) = pI(t)$$

where θ(t) is the rotation angle at time t, m is the mass of the oscillation beam, f(t) is the applied force, r and w are the damping coefficient and resonant frequency of the oscillation, respectively. For an electromagnetic MEMS, the force f(t) is linearly proportional to the current I(t) flowing through the MEMS coil, with a proportion coefficient p. The coil itself will also produce a motion-induced signal 414.

An amplifier with a bandpass filter 412 is configured to receive the motion-induced signal 414 from the set of driving wires coupled to the electromagnetic MEMS actuator 410 based on movement of a MEMS coil of the electromagnetic MEMS actuator 410 in response to the driving signal 408. In one embodiment, the motion-induced signal 414 is a voltage determined using formula: $V=-N*S*d(B*\sin\theta)/dt$, where N is a number of coil turns of a coil of the electromagnetic MEMS actuator 410, S is an area of the coil, B is a magnetic field, and θ is an angle of a coil plane to the magnetic field. Under resonant vibration, θ(t) can be expressed as $\theta(t)=\theta_0*\sin(\omega t+\phi)$, and sin θ(t), with Taylor series expansion, is the sum of a series of ω, 3ω, 5ω . . . components.

In one embodiment, the amplifier with a bandpass filter 412 is configured to filter the motion-induced signal 414 by allowing ω components to pass through and suppressing the higher order components, and amplify with gain G the filtered motion-induced signal 414 to generate an amplified filtered motion-induced signal 416. In one embodiment, the amplified filtered motion-induced signal 416 is a voltage represented by formula $V_1(t)=G*N*S*B*d\theta/dt$.

The amplified filtered motion-induced signal 416 is fed back to the driver unit 404. The driver unit 404 is configured to adjust the driving signal 408 based on the amplified filtered motion-induced signal 416 to reduce the oscillation of the electromagnetic MEMS actuator 410. In one embodiment, voltage-to-current driving circuit is used to generate the required driving current (driving signal 408) of the MEMS coil. The control voltage is the sum of the original driving voltage and V1, and the produced driving current I(t) may be expressed as $$I(t)=I0(t)+gG*N*S*B*d\theta/dt$$

where I0(t) is the original driving current without feedback, and g is the conductance of the voltage-to-current circuit.

In one embodiment, the angular vibration equation may be rewritten as $$\frac{d^2\theta(t)}{dt^2}+\frac{r-mpgGNSB}{m}\frac{d\theta(t)}{dt}+\omega^2\theta(t)=pI_0(t)$$

In one embodiment, the effective damping coefficient is changed from r to r-mpgGNSB. m, p, g, N, S, B may be predetermined in the phase of the MEMS design. The gain G, as well as its polarity, may be changed to achieve optimal damping coefficient. As an example, in a typical electromagnetic MEMS, V(t) is typically a few millivolts, and the optimal G is in the range of 5-50.

Figure 5:
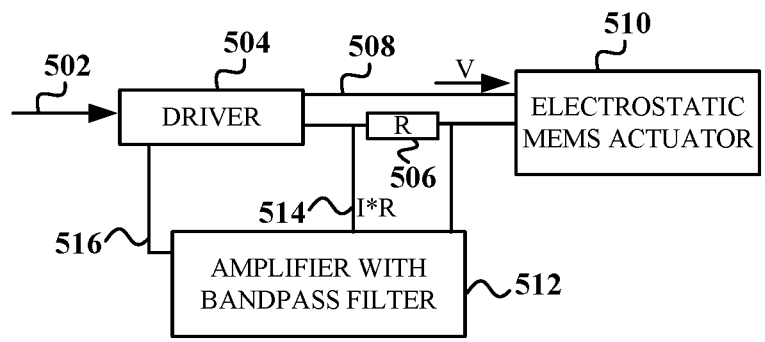
FIG. 5 is a schematic diagram illustrating an example of a feedback loop for reducing the oscillation of an electrostatic MEMS actuator in accordance with an embodiment.

FIG. 5 is a schematic diagram illustrating an example of a feedback loop for reducing the oscillation of an electrostatic MEMS actuator in accordance with an embodiment. In the depicted embodiment, a control signal 502 is sent to a driver unit 504 that is configured to generate a driving signal 508 to adjust a MEMS mirror that uses an electrostatic MEMS actuator 510. For an electrostatic MEMS, its angular vibration equation may be expressed as:

$$\frac{d^2\theta(t)}{dt^2}+\frac{r}{m}\frac{d\theta(t)}{dt}+\omega^2\theta(t)=qU(t)$$

Where U(t) is the voltage applied to the electrostatic MEMS actuator, and q is a proportion coefficient defined as the produced force at unit voltage.

An amplifier with a bandpass filter 512 is configured to receive a motion-induced signal 514 from the set of driving wires coupled to the electrostatic MEMS actuator 510 in response to the driving signal 508. In one embodiment, the motion-induced signal 514 is a current determined using formula: $I=U_0*d(C(\theta))/dt$, where $U_0$ is the voltage applied to the electrostatic MEMS actuator, θ is an angle of two electrode plates of the electrostatic MEMS actuator, and C(θ) is a capacitance of the two electrode plates of the electrostatic MEMS actuator which depends on θ. Under resonant vibration, θ(t) can be expressed as $\theta(t)=\theta_0*\sin(\omega t+\phi)$. C(θ) is a nonlinear function of θ(t): $C(\theta)=C_0+K_1\theta+K_2\theta^2+\ldots$. In one embodiment, the motion-induced signal 514 passes through a resistor 506 that is configured to convert a current signal to a voltage signal before being received by the amplifier with a bandpass filter 512.

The amplifier with a bandpass filter 512 is configured to filter the motion-induced signal 514 to allow ω components to pass through and suppress the higher order components. The amplifier with a bandpass filter 512 amplifies the filtered motion-induced signal 514 with gain M to generate an amplified filtered motion-induced signal 516. In one embodiment, the amplified filtered motion-induced signal 516 may be expressed as:

$$U_1(t)=MRU_0K_1*d\theta/dt$$

The amplified filtered motion-induced signal 516 is fed back to the driver unit 504. The driver unit 504 is configured to adjust the driving signal 508 based on the amplified filtered motion-induced signal 516 to reduce the oscillation of the electrostatic MEMS actuator 510. In one embodiment, the angular vibration equation may be rewritten as $$\frac{d^2\theta(t)}{dt^2}+\frac{r-qMRU_0K_1}{m}\frac{d\theta(t)}{dt}+\omega^2\theta(t)=qU_0(t)$$

In one embodiment, the effective damping coefficient is changed from r to r-qMR $U_0K_1$. q, $U_0$, $K_1$ may be predetermined during the MEMS design phase. M and R may be altered to achieve optimal damping coefficient. As an example, in a typical electrostatic MEMS, I(t) is typically tens of nano Ampere, and the optimal MR is in the range of $10^4$-$10^9$ ohm.

Figure 6:
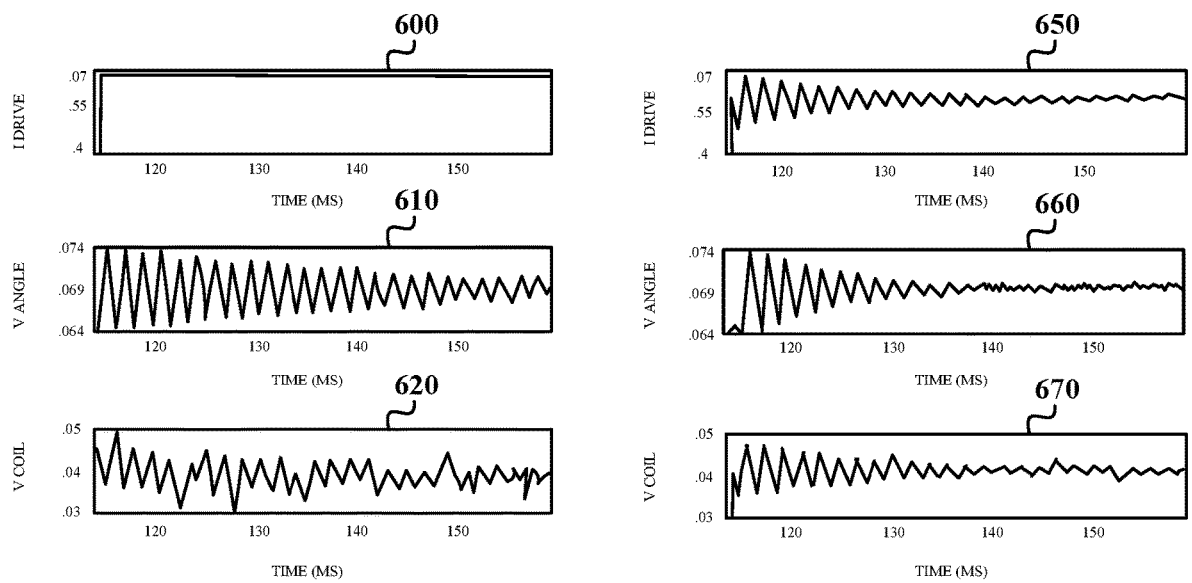
FIG. 6 illustrates simulated graphs that show a reduction in the oscillation of a MEMS actuator in accordance with an embodiment.

FIG. 6 illustrates simulated graphs that show a reduction in the oscillation of a MEMS actuator in accordance with an embodiment. Graph 600 illustrates a step drive current for an electromagnetic MEMS actuator. As shown, the step drive current goes from 0 milliamperes (mA) to 0.07 mA instantaneously and stays at 0.07 mA. Graph 610 shows the oscillation of the MEMS actuator based on the step drive current in graph 600. As shown, the angle of the MEMS actuator oscillates drastically when the drive current is first introduced and gradually reduces over time. Graph 620 shows the induced voltage produced on the MEMS coil of the MEMS actuator based the step drive current in graph 600. As shown, the induced voltage on the MEMS coil is sporadic and slowly decreases over time.

In accordance with the disclosed embodiments, graph 650 illustrates an example of a drive current for an electromagnetic MEMS actuator. As shown, the drive current increases initially and fluctuates based on a feedback signal as described above. Graph 660 shows the oscillation of the MEMS actuator based on the drive current in graph 650. As depicted in graph 660, the angle of the MEMS actuator oscillates drastically when the drive current is first introduced. However, the oscillation of the MEMS actuator reduces significantly faster as shown in graph 660 using the disclosed embodiments as compared to the oscillation of the MEMS actuator as shown in graph 610 using the step drive current approach. Additionally, graph 670 illustrates that the induced voltage produced on the MEMS coil of the MEMS actuator based on the drive current in graph 650 is smoother and reduces significantly faster as compared to the results in graph 620 using the step drive current. Accordingly, the disclosed embodiments illustrate that when the induced voltage on the coil is band-passed, amplified, and fed back to the driver, the oscillation of MEMS actuator stops much faster. Thus, an active "friction" is produced by the feedback. Similar simulated results also occur if the oscillation of the MEMS actuator is caused by an external vibration shock. The feedback loop as described above dampens the oscillation significantly faster than without use of the feedback loop.

Figure 7:
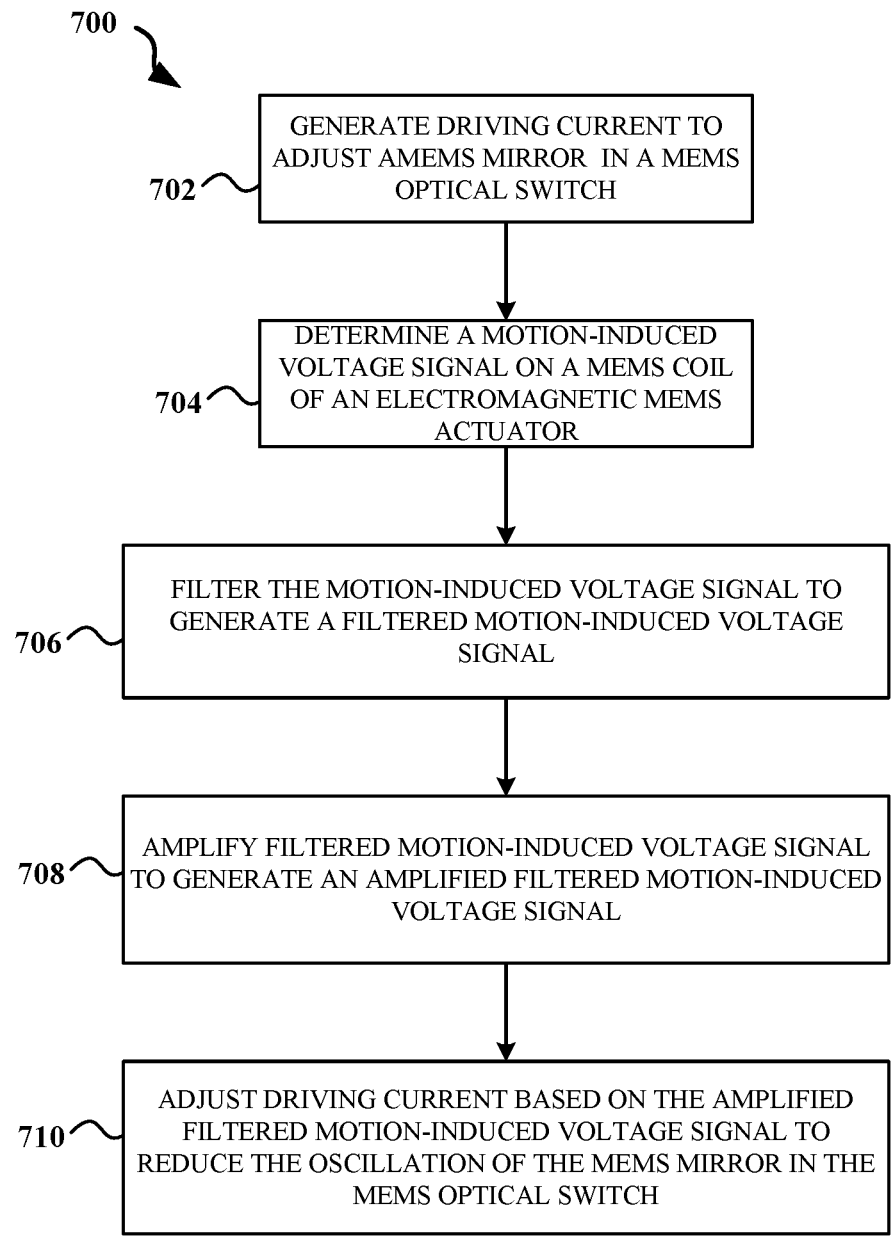
FIG. 7 is a flowchart diagram illustrating an example of a method for reducing the oscillation of a MEMS actuator in accordance with an embodiment.

FIG. 7 is a flowchart diagram illustrating an example of a method 700 for reducing the oscillation of a MEMS actuator in accordance with an embodiment. The method 700 begins at step 702 by generating a driving signal to a MEMS actuator to adjust a MEMS mirror in a MEMS optical switch. The driving signal is based on the degree or desired angle of the MEMS mirror for reflecting an optical signal to a desired output port. The method 700 at step 704 determines a motion-induced signal from the set of driving wires coupled to the MEMS actuator in response to the driving signal. The method 700 at step 706 filters the motion-induced signal to generate a filtered motion-induced signal. In one embodiment, the filtering process removes a direct current component from the motion-induced signal. The method 700 at step 708 amplifies the filtered motion-induced signal to generate an amplified filtered motion-induced signal. In one embodiment, the filtered motion-induced signal may be amplified between 5× to 50× the original power. The method 700 at step 710 adjusts the driving current based on the amplified filtered motion-induced signal to reduce the oscillation of the MEMS actuator.

Accordingly, the disclosed embodiments provide methods and apparatus for reducing the oscillation of a MEMS actuator. Advantages of the disclosed embodiments include increasing the response time of a MEMS-based switch, and its tolerance to internal and external vibrations. The disclosed embodiments may be implemented in an existing MEMS optical switch as it uses the existing wires. The cost to add an amplifier for each channel is minimal (e.g., $0.1). The disclosed embodiments are easier, less costly, and safer to implement than other previous attempts to reduce the oscillation of a MEMS actuator that require the use of high pressure gas, additional digital-to-analog converters (DACs) for each channel, and/or additional sensors and wires at the MEMS mirror to measure the actual angle and provide feedback.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented. The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate, preclude, or suggest that a combination of these measures cannot be used to advantage. A computer program may be stored or distributed on a suitable medium, such as an optical storage medium or a solid-state medium supplied together with, or as part of, other hardware, but may also be distributed in other forms, such as via the Internet or other wired or wireless telecommunication systems.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method for reducing an oscillation of a microelectromechanical systems (MEMS) actuator, the method comprising:
generating, by a driver unit, a driving signal to adjust the MEMS actuator through a set of driving wires coupled to the MEMS actuator;
receiving, by an amplifier with a bandpass filter, a motion-induced signal from the set of driving wires coupled to the MEMS actuator in response to the driving signal;
filtering, by the bandpass filter, the motion-induced signal to generate a filtered motion-induced signal;
amplifying, by the amplifier, the filtered motion-induced signal to generate an amplified filtered motion-induced signal; and
adjusting, by the driver unit, the driving signal based on the amplified filtered motion-induced signal to reduce the oscillation of the MEMS actuator.

2. The method of claim 1, wherein the MEMS actuator is an electromagnetic MEMS actuator, and a voltage V of the motion-induced signal is determined by:

$$V=-N*S*d(B*\sin\theta)/dt,$$

where N is a number of coil turns of a coil of the electromagnetic MEMS actuator, S is an area of the coil, B is a magnetic field, and $\theta$ is an angle of a coil plane to the magnetic field.

3. The method of claim 1, wherein the MEMS actuator is an electrostatic MEMS actuator, and a current I of the motion-induced signal is determined by:

$$I=U_0*d(C(\theta))/dt,$$

where $U_0$ is the voltage applied to the electrostatic MEMS actuator, $\theta$ is an angle of two electrode plates of the electrostatic MEMS actuator, and $C(\theta)$ is a capacitance of the two electrode plates of the electrostatic MEMS actuator which depends on $\theta$.

4. The method of claim 1, wherein the motion-induced signal is amplified between 5× and 50×.

5. The method of claim 1, wherein filtering the motion-induced signal removes a direct current component from the motion-induced signal.

6. The method of claim 1, wherein the oscillation of the MEMS actuator is caused in part by external vibration shock to the MEMS actuator.

7. A microelectromechanical systems (MEMS) optical switch comprising:
- a driver unit configured to generate a driving signal to adjust a MEMS actuator through a set of driving wires coupled to the MEMS actuator;
- an amplifier with a bandpass filter configured to receive a motion-induced signal from the set of driving wires coupled to the MEMS actuator in response to the driving signal, the bandpass filter configured to filter the motion-induced signal to generate a filtered motion-induced signal, and the amplifier configured to amplify the filtered motion-induced signal to generate an amplified filtered motion-induced signal; and
- wherein the driver unit is configured to adjust the driving signal based on the amplified filtered motion-induced signal to reduce an oscillation of the MEMS actuator.

8. The MEMS optical switch of claim 7, wherein the MEMS actuator is an electromagnetic MEMS actuator, and a voltage V of the motion-induced signal is determined by:

$$V = -N*S*d(B*\sin\theta)/dt,$$

where N is a number of coil turns of a coil of the electromagnetic MEMS actuator, S is an area of the coil, B is a magnetic field, and $\theta$ is an angle of a coil plane to the magnetic field.

9. The MEMS optical switch of claim 7, wherein the MEMS actuator is an electrostatic MEMS actuator, and a current I of the motion-induced signal is determined by:

$$I = U_0 * d(C(\theta))/dt,$$

where $U_0$ is the voltage applied to the electrostatic MEMS actuator, $\theta$ is an angle of two electrode plates of the electrostatic MEMS actuator, and $C(\theta)$ is a capacitance of the two electrode plates of the electrostatic MEMS actuator which depends on $\theta$.

10. The MEMS optical switch of claim 7, wherein the motion-induced signal is amplified between 5× and 50×.

11. The MEMS optical switch of claim 7, wherein filtering the motion-induced signal removes a direct current component from the motion-induced signal.

12. The MEMS optical switch of claim 7, wherein the oscillation of the MEMS actuator is caused in part by external vibration shock to the MEMS actuator.

13. A method for reducing an oscillation of an electromagnetic microelectromechanical systems (MEMS) actuator, the method comprising:
- generating, by a driver unit, a driving current to adjust the electromagnetic MEMS actuator through a set of driving wires coupled to the electromagnetic MEMS actuator;
- receiving, by an amplifier with a bandpass filter, a motion-induced signal from the set of driving wires coupled to the electromagnetic MEMS actuator in response to the driving current;
- filtering, by the bandpass filter, the motion-induced signal to generate a filtered motion-induced signal;
- amplifying, by the amplifier, the filtered motion-induced signal to generate an amplified filtered motion-induced signal; and
- adjusting the driving current based on the amplified filtered motion-induced signal to reduce the oscillation of the electromagnetic MEMS actuator.

14. The method of claim 13, wherein a voltage V of the motion-induced signal is determined by:

$$V = -N*S*d(B*\sin\theta)/dt,$$

where N is a number of coil turns of a coil of the electromagnetic MEMS actuator, S is an area of the coil, B is a magnetic field, and $\theta$ is an angle of a coil plane to the magnetic field.

15. The method of claim 13, wherein the motion-induced signal is amplified between 5× and 50×.

16. The method of claim 13, wherein filtering the motion-induced signal removes a direct current component from the motion-induced signal.

17. The method of claim 13, wherein the oscillation of the electromagnetic MEMS actuator is caused in part by external vibration shock to the electromagnetic MEMS actuator.

* * * * *